US011319460B2

(12) United States Patent
Ito et al.

(10) Patent No.: US 11,319,460 B2
(45) Date of Patent: May 3, 2022

(54) POLISHING COMPOSITION

(71) Applicant: FUJIMI INCORPORATED, Kiyosu (JP)

(72) Inventors: Yasuaki Ito, Kiyosu (JP); Hiroyuki Oda, Kiyosu (JP); Naoto Noguchi, Kiyosu (JP)

(73) Assignee: FUJIMI INCORPORATED, Kiyosu (JP)

( * ) Notice: Subject to any disclaimer, the term of this patent is extended or adjusted under 35 U.S.C. 154(b) by 0 days.

(21) Appl. No.: 16/495,631

(22) PCT Filed: Mar. 19, 2018

(86) PCT No.: PCT/JP2018/010817
§ 371 (c)(1),
(2) Date: Sep. 19, 2019

(87) PCT Pub. No.: WO2018/174008
PCT Pub. Date: Sep. 27, 2018

(65) Prior Publication Data
US 2020/0109313 A1    Apr. 9, 2020

(30) Foreign Application Priority Data
Mar. 23, 2017    (JP) .............................. JP2017-057610

(51) Int. Cl.
C09G 1/04    (2006.01)
C08K 5/14    (2006.01)
H01L 21/304    (2006.01)
H01L 29/16    (2006.01)
C08K 3/26    (2006.01)

(52) U.S. Cl.
CPC .................. C09G 1/04 (2013.01); C08K 3/26 (2013.01); C08K 5/14 (2013.01); H01L 21/304 (2013.01); H01L 29/1608 (2013.01); C08K 2003/262 (2013.01)

(58) Field of Classification Search
None
See application file for complete search history.

(56) References Cited

U.S. PATENT DOCUMENTS

| | | | | |
|---|---|---|---|---|
| 6,429,133 | B1 * | 8/2002 | Chopra | C09G 1/04 257/E21.304 |
| 7,972,970 | B2 * | 7/2011 | Mayer | C23F 1/02 438/754 |
| 2004/0134873 | A1 * | 7/2004 | Yao | H01L 21/3212 216/2 |
| 2005/0056368 | A1 | 3/2005 | Schroeder | |
| 2007/0039926 | A1 * | 2/2007 | Cherian | C09G 1/04 216/88 |
| 2007/0147551 | A1 | 6/2007 | Mabuchi et al. | |
| 2008/0057832 | A1 | 3/2008 | Schroeder | |
| 2009/0318063 | A1 * | 12/2009 | Misra | B24B 37/26 451/28 |
| 2010/0104806 | A1 | 4/2010 | Schwandner | |
| 2010/0178765 | A1 | 7/2010 | Nomura et al. | |
| 2012/0164833 | A1 | 6/2012 | Ishibashi | |
| 2014/0057438 | A1 | 2/2014 | Yoshida | |
| 2014/0220299 | A1 | 8/2014 | Yoshida | |
| 2017/0283987 | A1 | 10/2017 | Yoshida | |
| 2017/0342298 | A1 | 11/2017 | Yoshida | |
| 2019/0010357 | A1 | 1/2019 | Kamada et al. | |
| 2020/0332163 | A1 * | 10/2020 | Matsuo | H01L 21/304 |

FOREIGN PATENT DOCUMENTS

| | | | |
|---|---|---|---|
| CN | 101054664 | A * | 10/2007 |
| CN | 101263209 | A | 9/2008 |
| CN | 103493183 | A | 1/2014 |
| CN | 103857765 | A | 6/2014 |
| CN | 104293207 | A | 1/2015 |
| CN | 109392311 | A | 2/2016 |
| JP | 2010-109370 | A | 5/2010 |
| JP | 2011-159998 | A | 8/2011 |
| JP | 2012-119697 | A | 6/2012 |
| JP | 2012-174924 | A | 9/2012 |
| JP | 2012-253259 | A | 12/2012 |
| JP | 2014-044982 | A | 3/2014 |
| TW | 201250812 | A1 | 12/2012 |
| WO | WO-2007/021716 | A2 | 2/2007 |
| WO | WO-2007/074734 | A1 | 7/2007 |
| WO | WO-2012147605 | A1 | 11/2012 |
| WO | WO-2013051555 | A1 | 4/2013 |

(Continued)

OTHER PUBLICATIONS

English translation of the International Preliminary Report on Patentability issued in corresponding patent application No. PCT/JP2018/010817 dated Oct. 3, 2019.
Office Action issued in corresponding Chinese Application No. 201880020117.2 dated Aug. 31, 2020 with English translation.
Supplemental European Search Report issued in corresponding European Application No. 18771503.2 dated Nov. 20, 2020.
Office Action issued in corresponding Chinese Patent Application No. 201880020117.2 dated Apr. 19, 2021 with English translation.
U.S. Appl. No. 17/541,881, filed Dec. 3, 2021, Ito et al.
Extended European Search Report issued in corresponding European Patent Application No. 21180087.5 dated Oct. 12, 2021.

(Continued)

Primary Examiner — Allan W. Olsen
(74) Attorney, Agent, or Firm — Foley & Lardner LLP

(57) ABSTRACT

Provided is a polishing composition that can effectively improve a polishing removal rate. According to the present invention, a polishing composition for polishing a polishing target material is provided. The polishing composition contains water, an oxidant, and a polishing removal accelerator, and does not contain abrasive. At least one metal salt selected from the group consisting of an alkali metal salt and an alkaline earth metal salt is contained as the polishing removal accelerator.

11 Claims, No Drawings

(56) References Cited

FOREIGN PATENT DOCUMENTS

WO   WO-2016/208301 A1   12/2016
WO   WO2017212971  A1   12/2017

OTHER PUBLICATIONS

Office Action issued in corresponding Japanese Patent Application No. 2019-507663 dated Nov. 11, 2021 with English translation.
Office Action issued in corresponding Chinese Patent Application No. 201880020117.2 dated Nov. 17, 2021 with English translation.
Office Action issued in corresponding Taiwanese Patent Application No. 107109978 dated Dec. 21, 2021.
Chinese OA dated Feb. 23, 2022 with its English translation.

* cited by examiner

POLISHING COMPOSITION

TECHNICAL FIELD

The present invention relates to a polishing composition, and specifically, to a polishing composition used for polishing a polishing target material. The present application claims priority based on Japanese Patent Application No. 2017-57610 filed on 23 Mar. 2017, the entire contents of which application are incorporated herein by reference.

BACKGROUND ART

The surface of a polishing target material such as diamond, sapphire (aluminum oxide), silicon carbide, boron carbide, tungsten carbide, silicon nitride, and titanium nitride is generally processed by polishing (lapping) that is performed by supplying a diamond abrasive to polishing platen. However, in lapping using diamond abrasive, defects and distortions are likely to occur due to the generation and remaining of scratches and the like. Therefore, after lapping using diamond abrasive or in place of the lapping, polishing in which a polishing pad is used and a polishing slurry is supplied between the polishing pad and a polishing object is studied. Examples of literature in which this type of the related art is disclosed include Patent Literature 1 to 3.

CITATION LIST

Patent Literature

Patent Literature 1: WO 2013/051555
Patent Literature 2: Japanese Patent Application Publication No. 2011-159998
Patent Literature 3: Japanese Patent Application Publication No. 2012-253259

SUMMARY OF INVENTION

Technical Problem

In recent years, in a polishing composition used for polishing a surface of a polishing object such as silicon carbide, in order to reduce the number of dent defects such as scratches and latent defects that are not detected in morphological observation, there is a demand to use abrasive as little as possible. However, there is a problem of a polishing removal rate (an amount of a surface of a polishing object removed per unit time) decreasing if abrasive is not used. In this regard, in Patent Literature 1, in a polishing composition containing no abrasive, it has been proposed that a polishing removal rate is improved by devising components such as an oxidant. However, in such a technique, it is insufficient to meet a practically required level for a polishing removal rate and there is still room for improvement.

The present invention has been made in view of the above circumstances and a main object of the present invention is to provide a polishing composition that can effectively improve a polishing removal rate in polishing of a polishing object and can reduce the number of dent defects such as scratches and latent defects that are not detected in morphological observation. Another related object is to provide a method of polishing a polishing object using the polishing composition.

Solution to Problem

According to the present invention, a polishing composition used for polishing a polishing object is provided. The polishing composition contains water, an oxidant, and a polishing removal accelerator and does not contain an abrasive. The polishing composition contains at least one metal salt selected from the group consisting of an alkali metal salt and an alkaline earth metal salt as the polishing removal accelerator. Since a polishing composition containing an alkali metal salt and/or an alkaline earth metal salt as the polishing removal accelerator is used in this manner, a polishing removal rate can be greatly improved in the polishing composition containing no abrasive.

In a preferred aspect of the polishing composition disclosed here, a pH is 5.5 or higher. In the polishing composition having a pH in the above range, the application effect of the present invention can be more suitably exhibited.

In a preferred aspect of the polishing composition disclosed here, a ratio ($C_1/C_2$) of a concentration $C_1$ [mol/L] of the metal salt to a concentration $C_2$ [mol/L] of the oxidant in the polishing composition is in a range of 0.001 to 70. The polishing removal accelerator and the oxidant are used in combination so that a specific concentration ratio is obtained, and thus a polishing removal rate improving effect can be more suitably exhibited.

In a preferred aspect of the polishing composition disclosed here, a construction material of the polishing object has a Vickers hardness of 1,500 Hv or higher. In the polishing composition in which the polishing target material is a material having a high hardness, the application effect of the present invention can be more suitably exhibited.

In a preferred aspect of the polishing composition disclosed here, a construction material of the polishing object is silicon carbide. In the polishing composition in which the polishing target material is silicon carbide, the application effect of the present invention can be more suitably exhibited.

In addition, according to the present invention, a method of polishing a polishing object is provided. The polishing method includes supplying any of the polishing compositions disclosed here to a polishing object and polishing the polishing object. According to the polishing method, it is possible to efficiently provide a polishing object that is polished (polished object).

DESCRIPTION OF EMBODIMENTS

Preferred embodiments of the present invention will be described below. Incidentally, matters that is other than those particularly mentioned herein but are necessary for implementation of the present invention can be recognized by those skilled in the art as design matters based on the prior art in the relevant field. The present invention can be implemented based on content disclosed herein and common general technical knowledge in the field.

<Polishing Object>

A polishing composition disclosed here can be applied for polishing a polishing object made of a material containing no oxygen as a constituting element. Since it is thought that a polishing object is altered with an oxidant, and the altered layer is removed, and thus polishing proceeds, the polishing object is preferably a material that is not oxidized. Examples of a construction material of a polishing object include a monoelemental semiconductor or a monoelemental insulator such as silicon, germanium, and diamond; a ceramic material such as silicon nitride, tantalum nitride, and titanium carbide; a semiconductor substrate material of Groups IIB-VIB (Groups 12-16) compounds such as cadmium telluride, zinc selenide, cadmium sulfide, cadmium mercury telluride, and zinc cadmium telluride; a semiconductor substrate material of Groups IIIB-VB (Groups 13-15) compounds such as gallium nitride, gallium arsenide, gallium phosphide, indium phosphide, aluminum gallium arsenide, indium gallium arsenide, indium gallium arsenide nitride, and aluminum gallium indium phosphide; a semiconductor substrate material of Groups IVB-IVB (Groups 14-14) compounds such as silicon carbide, and germanium silicide; and the like. A polishing object made of a plurality of materials among them may be used. Among them, it is preferably used for polishing a material having a Vickers hardness of 500 Hv or higher. A Vickers hardness of a polishing target material is preferably 700 Hv or higher (for example 1,000 Hv or higher, typically 1,500 Hv or higher). The upper limit of the Vickers hardness is not particularly limited, and may be about 7,000 Hv or lower (for example, 5,000 Hv or lower, typically 3,000 Hv or lower). Herein, the Vickers hardness can be measured based on JIS R 1610:2003. The international standard corresponding to the JIS standard is ISO 14705:2000.

Examples of a material having a Vickers hardness of 1,500 Hv or higher include diamond, silicon carbide, silicon nitride, titanium nitride, gallium nitride and the like. The polishing composition disclosed here can be preferably applied to a single crystal surface of the material that is mechanically and chemically stable. Among them, the surface of the polishing object is preferably made of any of diamond, silicon carbide, and gallium nitride, and more preferably made of silicon carbide. Silicon carbide is expected to be a semiconductor substrate material having low power loss and excellent heat resistance and the like, and has a particularly large practical advantage of improving surface properties. The polishing composition disclosed here is particularly preferably applied to a single crystal surface of silicon carbide.

<Polishing Composition>
(Metal Salt A)

The polishing composition disclosed here contains at least one metal salt A selected from the group consisting of an alkali metal salt and an alkaline earth metal salt as a polishing removal accelerator. In polishing, the oxidant causes a surface of a polishing target material (particularly, a surface of a material having a high hardness such as silicon carbide) to be altered, and the altered layer is removed due to friction with a polishing pad. While such a metal salt A need not be considered to be limited, it is thought that it exhibits a catalytic action for promoting the alteration and removal, and contributes to improvement of a polishing removal rate. Typically, the metal salt A preferably contains any one or two or more elements among lithium (Li), sodium (Na), potassium (K), rubidium (Rb), cesium (Cs), magnesium (Mg), calcium (Ca), strontium (Sr), and barium (Ba). Among them, any of Na, K, Ca, and Sr is preferable, and K or Ca is particularly preferable.

In the metal salt A, the type of salt is not particularly limited, and an inorganic acid salt or an organic acid salt may be used. Examples of the inorganic salt include salts of hydroharogenic acid (for example, hydrochloric acid, hydrobromic acid, and hydrofluoric acid), nitric acid, sulfuric acid, carbonic acid, silicic acid, boric acid, phosphoric acid and the like. In addition, examples of the organic salt include salts of carboxylic acid (for example, formic acid, acetic acid, propionic acid, benzoic acid, glycine acid, butyric acid, citric acid, tartaric acid, and trifluoroacetic acid), organic sulfonic acid (for example, methanesulfonic acid, trifluoromethanesulfonic acid, benzenesulfonic acid, and toluenesulfonic acid), organic phosphonic acid (for example, methyl phosphonic acid, benzene phosphonic acid, and toluene phosphonic acid), organic phosphoric acid (for example, ethyl phosphoric acid), and the like. Among them, a hydrochloride or a nitrate is preferable, and a nitrate is particularly preferable.

Specific examples of the metal salt A include metal salts A substantially composed of any of chlorides such as lithium chloride, sodium chloride, potassium chloride, magnesium chloride, calcium chloride, strontium chloride, and barium chloride; bromides such as sodium bromide, potassium bromide, and magnesium bromide; fluorides such as lithium fluoride, sodium fluoride, potassium fluoride, magnesium fluoride, calcium fluoride, strontium fluoride, and barium fluoride; nitrates such as lithium nitrate, sodium nitrate, potassium nitrate, magnesium nitrate, calcium nitrate, strontium nitrate, and barium nitrate; sulfates such as lithium sulfate, sodium sulfate, potassium sulfate, magnesium sulfate, calcium sulfate, strontium sulfate, and barium sulfate; carbonates such as potassium carbonate, potassium hydrogen carbonate, sodium carbonate, sodium hydrogen carbonate, magnesium carbonate, calcium carbonate, strontium carbonate, and barium carbonate; borates such as sodium borate; and acetates such as potassium acetate, sodium acetate, calcium acetate, and strontium acetate. The metal salt A may be used singly or in combination of two or more types.

The metal salt A may be dissolved in the polishing composition and may be dispersed as a solid. That is, the metal salt A may be water-soluble or non-water soluble. In addition, in the polishing composition, some of the metal salt A may be dissolved, and the remainder may be dispersed as a solid. In a preferred embodiment, the metal salt A is a water-soluble salt. When the water-soluble metal salt A is used and a polishing composition contains substantially no solid component, a favorable surface with few defects, including, for example, dent defects such as scratches and latent defects that are not detected in morphological observation, can be efficiently formed. In addition, in a preferred embodiment, the metal salt A may be a salt that is dissolved in water and exhibits a neutral range (typically a normal salt that is generated by neutralization of a strong acid and a strong base). When the metal salt A in which an aqueous solution exhibits a neutral range (for example, pH 6 to 8, preferably, pH 6.5 to 7.5) is used, a high-quality surface in which the number of defects such as scratches is further reduced can be efficiently formed. Examples of the metal salt A in which an aqueous solution is neutral include chlorides such as sodium chloride, potassium chloride, calcium chloride, and strontium chloride, and nitrates such as sodium nitrate, potassium nitrate, calcium nitrate, and strontium nitrate. Among them, calcium chloride, strontium chloride, potassium nitrate, calcium nitrate, and strontium nitrate are preferable because a favorable surface can be efficiently formed. Among them, calcium chloride and calcium nitrate are particularly preferable.

The "latent defects that are not detected in morphological observation" herein typically refer to defects that are not detected in observation using a SiC wafer defect tester/review device (model: SICA6X, commercially available from Lasertec Corporation). The latent defects can be detected in observation, for example, using an atomic force microscope (AFM) device at a viewing angle of 10 μm×810 μm.

A concentration (content) $C_1$ of the metal salt A in the polishing composition is not particularly limited, and is generally appropriately 10 mol/L or lower. When the concentration $C_1$ of the metal salt A is reduced, a polishing removal rate improving effect on the surface of a polishing target material (particularly a material having a high hardness) can be achieved at a higher level. From the viewpoints of polishing removal rate and the like, the concentration C1 is appropriately 10 mol/L or lower, preferably 8 mol/L or lower, and more preferably 6 mol; or lower (for example, 3 mol/L or lower or 1.5 mol/L or lower). The lower limit of the concentration C1 is not particularly limited as long as it exceeds 0 (zero), and from the viewpoint that the effects of the present invention to be easily exhibited, the concentration C1 is generally appropriately 0.0001 mol/L or higher, preferably 0.0005 mol/L or higher, more preferably 0.001 mol/L or higher, and even more preferably 0.003 mol/L or higher. The concentration C1 may be, for example, 0.005 mol/L or higher, and typically 0.01 mol/L or higher (for example, 0.03 mol/L or higher). In the art disclosed here, for example, an embodiment in which the concentration C1 of the metal salt A in the polishing composition of 0.0002 mol/L to 5 mol/L can be preferably performed.

(Oxidant)

The polishing composition disclosed here contains an oxidant in addition to the metal salt A. The oxidant can cause an oxidation reaction with the surface of the polishing object in polishing and can effectively make the hardness reduction and embrittlement of the surface. When such an oxidant and the metal salt A are used in combination, it is possible to improve a polishing removal rate more effectively. The oxidant is not particularly limited as long as it is a substance having an oxidation-reduction potential sufficient to exhibit an action of oxidizing the surface of the polishing object. For example, the oxidant may be a substance having an oxidation-reduction potential higher than the oxidation-reduction potential of the polishing target material at a pH at which polishing is performed, that is, at the same pH as that of the polishing composition. Meanwhile, for example, the metal salt A may be a substance having an oxidation-reduction potential lower than the oxidation-reduction potential of the polishing target material at a pH at which polishing is performed, that is, at the same pH as that of the polishing composition. Here, for the oxidation-reduction potential of the polishing target material, a value obtained is adopted when powder of the material is dispersed in water to form a slurry, the slurry is adjusted to the same pH as that of the polishing composition, and an oxidation-reduction potential (an oxidation-reduction potential with respect to a standard hydrogen electrode at a liquid temperature of 25° C.) of the slurry is then measured using a commercially available oxidation-reduction potentiometer.

Specific examples of the oxidant include peroxides such as hydrogen peroxide; nitrate compounds such as nitric acid, salts thereof including iron nitrate, silver nitrate, aluminum nitrate, and complexes thereof including cerium ammonium nitrate; persulfate compounds such as persulfuric acid including peroxomonosulfuric acid, peroxodisulfuric acid and the like, and salts thereof including persulfate ammonium, persulfate potassium and the like; chlorine-containing compounds such as chloric acid and salt thereof, perchioric acid and salt there of including potassium perchlorate; bromine-containing compounds such as bromic acid and salt thereof including potassium bromate; iodine-containing compounds such as iodic acid and salts thereof including ammonium iodate, and periodic acid and salts thereof including sodium periodate and potassium periodate; ferric acids such as ferric acid and salts thereof including potassium ferrate; permanganic acids such as permanganic acid and salts thereof including sodium permanganate and potassium permanganate; chromic acids such as chromic acid and salts thereof including potassium chromate and potassium dichromate; vanadic acids such as vanadic acid and salts thereof including ammonium vanadate, sodium vanadate, and potassium vanadate; nuhenic acids such as perruthenic acid and salts thereof; molybdic acids such as molybdic acid and salts thereof including ammonium molybdate and disodium molybdate; rhenium acids such as perrhenic acid and salts thereof; and tungstic acids such as tungstic acid and salts thereof including disodium tungstate. These may be used singly or in combination of two or more types appropriately.

In a preferred embodiment, the polishing composition contains a composite metal oxide as an oxidant. Examples of the composite metal oxide include nitrate metal salts, ferric acids, permanganic acids, chromic acids, vanadic acids, ruthenic acids, molybdic acids, rhenium acids, and tungstic acids. Among them, ferric acids, permanganic acids, and chromic acids are more preferable, and permanganic acids is even more preferable.

In a more preferred embodiment, a composite metal oxide including a monovalent or divalent metal element (provided that transition metal elements are excluded) and a transition metal element in the fourth period in the periodic table is used as the composite metal oxide. Preferred examples of the monovalent or divalent metal element include Na, K, Mg, and Ca. Among them, Na and K are more preferable. Preferred examples of the transition metal element in the fourth period in the periodic table include Fe, Mn, Cr, V, and Ti. Among them, Fe, Mn, and Cr are more preferable, and Mn is even more preferable.

The concentration (content) C2 of the oxidant in the polishing composition is generally appropriately 0.001 mol/L or higher. From the viewpoint of achieving both the polishing removal rate and flatness at a high level and efficiently, the concentration C2 is preferably 0.005 mol/L or higher and more preferably 0.01 mol/L or higher (for example, 0.05 mol/L or higher). In addition, from the viewpoint of improving smoothness, the concentration C2 of the oxidant is generally appropriately 10 mol/L or lower, and preferably 5 mol/L or lower and more preferably 3 mol/L or lower (for example, 1 mol/L or lower or 0.5 mol/L or lower). In the art disclosed here, a mode in which the concentration C2 of the oxidant in the polishing composition is 0.07 mol/L to 0.3 mol/L can be preferably performed.

Although there is no particular limitation, from the viewpoint of more favorably exhibiting the effect obtained when the oxidant and the metal salt A are used in combination, a ratio (C1/C2) of C1 [mol/L] (a concentration of the metal salt A in the polishing composition, a total concentration if a plurality of metal salts A are contained) to C2 [mol/L] (a concentration of the oxidant, a total concentration if a plurality of oxidants are contained) is preferably about 100 or less. The C1/C2 is preferably 70 or less, more preferably 30 or less, further preferably 10 or less, and particularly preferably 1 or less. A polishing removal rate improving effect can be more suitably exhibited at such a concentration ratio (C1/C2) of the metal salt A and the oxidant. The lower limit of C1/C2 is not particularly limited as long as it exceeds 0 (zero), and from the viewpoint that the effects of the present invention to be easily exhibited, C1/C2 is preferably 0.001 or more, more preferably 0.002 or more, and further preferably 0.003 or more. The C1/C2 may be, for example, 0.01 or more, and typically 0.02 or more (for example, 0.03 or more).

The polishing composition disclosed here contains substantially no abrasive. This is because, when an abrasive is contained in the polishing composition, on the surface of the polishing object after polishing, dent defects such as scratches and latent defects that are not detected in morphological observation are generated, abrasive remains, or abrasive sticking defects and the like are generated, and thereby the quality of the surface can deteriorate. In addition, this is because a polishing machine can be damaged due to abrasive. Specific examples of the abrasive here include alumina abrasive, silica abrasive, diamond abrasive, cerium oxide abrasive, chromium oxide abrasive and the like. Here, when the polishing composition contains substantially no abrasive, this means at least that an abrasive is not added intentionally.

(Other Components)

As long as the effects of the present invention are not impaired, the polishing composition disclosed here may further contain, as necessary, known additives that can be used for a polishing composition (typically, a composition for polishing a material with a high hardness, for example, a composition for polishing a silicon carbide substrate) such as a chelating agent, a thickener, a dispersant, a surface protective agent, a wetting agent, a pH adjusting agent, a surfactant, an organic acid, an inorganic acid, a corrosion inhibitor, an antiseptic agent, and an antifungal agent. Since a content of the additive may be appropriately set according to the purpose of addition thereof, and does not characterize the present invention, detailed description thereof will be omitted.

(Solvent)

The solvent used for the polishing composition is not particularly limited as long as the metal salt A and the oxidant can be dispersed. Regarding the solvent, ion-exchange water (deionized water), pure water, ultrapure water, distilled water, or the like can be preferably used. The polishing composition disclosed here may further contain, as necessary, an organic solvent that can be uniformly mixed with water (lower alcohol, lower ketone, etc.). Generally, it is preferable that 90 vol % or more of the solvent contained in the polishing composition is water, and it is more preferable that 95 vol % or more (typically, 99 to 100 vol %) thereof is water.

The pH of the polishing composition is generally appropriately about 2 to 12. When the pH of the polishing composition is within the above range, a practical polishing removal rate is easily obtained. From the viewpoint of more favorably exhibiting the application effect of the art disclosed here, the pH of the polishing composition is preferably 3 or higher, more preferably 4 or higher, and even more preferably 5.5 or higher. The upper limit of pH is not particularly limited, and is preferably 12 or lower, more preferably 10 or lower, and even more preferably 9.5 or lower. The pH is preferably 3 to 11, more preferably 4 to 10, and further preferably 5.5 to 9.5. Although there is no particular limitation, it is thought that, when the pH is within a range of 5.5 to 9.5, both cations and anions in the metal salt A contribute to improvement of a polishing removal rate. Therefore, according to the art disclosed here, in the polishing composition having a pH of 5.5 to 9.5 and containing no abrasive, a polishing removal rate higher than that of the related art can be achieved. In addition, such a polishing composition causes little damage to a polishing machine and may be easily handled. The pH of the polishing composition may be, for example, 9 or lower, typically 7.5 or lower.

<Preparation of Polishing Composition>

A method for preparing the polishing composition disclosed here is not particularly limited. For example, the respective components contained in the polishing composition may be mixed using a well-known mixing device such as a blade type stirrer, an ultrasonic disperser, a homomixer or the like. A mode in which these components are mixed is not particularly limited, and, for example, all components may be mixed at once or may be mixed according to an appropriately set order.

The polishing composition disclosed here may be of one-agent type (one-part form) or a multi-agent type (multi-part form) including a two-agent type (two-part form). For example, the polishing composition may be configured to be prepared by mixing a Liquid A containing some of components (typically, components other than the solvent) constituting the polishing composition and a Liquid B containing the remaining components and to be used to polish the polishing object.

<Concentrate>

The polishing composition disclosed here may be in a concentrated form (that is, a form of a concentrate of the polishing liquid) before it is supplied to the polishing object. The polishing composition in such a concentrated form is advantageous from the viewpoints of convenience, cost reduction and the like during production, distribution, storage, and the like. The concentration factor can be, for example, about 2 times to 5 times in terms of volume.

The polishing composition in such a concentrated form can be used in a mode in which a polishing liquid is prepared by dilution at a desired timing and the polishing liquid is supplied to a polishing object. The dilution can be typically performed by adding the above-described solvent to the concentrate and performing mixing. In addition, when the solvent is a mixed solvent, only some of components constituting the solvent may be added and diluted or a nixed solvent containing such constituent components in an amount ratio different from that of the solvent may be added and diluted. In addition, in a multi-agent type polishing composition as will be described below, some agents among these may be diluted and other agents may be then mixed to prepare a polishing liquid or a plurality of agents may be mixed and the resulting mixture may be then diluted to prepare a polishing liquid.

<Polishing Method>

The polishing composition disclosed here can be used for polishing a polishing object, for example, in an embodiment including the following operations.

That is, a polishing liquid containing any of the polishing compositions disclosed here is prepared. Preparation of the polishing liquid may include preparation of a polishing liquid by performing operations such as concentration adjustment (for example, dilution) and pH adjustment on the polishing composition. Alternatively, the polishing composition may be directly used as a polishing liquid. In addition, in the case of a multi-agent type polishing composition, preparation of the polishing liquid may include mixing such agents, diluting one or a plurality of agents before the mixing, diluting the resulting mixture after the mixing and the like.

Next, the polishing liquid is supplied to the surface of the polishing object and polished by a general method. For example, a polishing object is set in a general polishing machine, the polishing liquid is supplied to the surface (polishing target surface) of the polishing object through a polishing pad of the polishing machine. Typically, while the polishing liquid is continuously supplied, the polishing pad is pressed against the surface of the polishing object, and they are moved relative to each other (for example, rotated and moved). Polishing of the polishing object is completed through such a polishing step.

According to the description herein, a polishing method in which a polishing target material is polished and a method in which a polished object is produced using the polishing method are provided. The polishing method includes a step of polishing a polishing object using the polishing composition disclosed here. A polishing method according to a preferred embodiment includes a step of performing preliminary polishing (stock polishing step) and a step of performing final polishing (final polishing step). The stock polishing step herein refers to a step of performing preliminary polishing on a polishing object. In a typical embodiment, the stock polishing step is a polishing step set immediately before the final polishing step. The stock polishing step may be a single-step of polishing or a polishing step in two or more sub-steps. The final polishing step herein refers to a step of performing final polishing on a polishing object on which stock polishing is performed and is a polishing step provided at the end (that is, on the most downstream side) among polishing steps performed using a polishing composition. In such a polishing method including a stock polishing step and a final polishing step, the polishing composition disclosed here may be used in the stock polishing step or may be in the final polishing step, or in both the stock polishing step and the final polishing step.

In a preferred embodiment, a polishing step using the polishing composition is a final polishing step. The polishing composition disclosed here contains no abrasive and can effectively reduce the number of dent defects such as scratches and latent defects that are not detected in morphological observation on the surface after polishing, and thus can be particularly preferably used as a polishing composition (composition for final polishing) used in the final polishing step performed on the surface of the polishing target material.

In another preferred embodiment, a polishing step using the polishing composition may be a stock polishing step. The polishing composition disclosed here is suitable as a polishing composition (composition for stock polishing) used for the stock polishing step performed on the surface of the polishing target material since a high polishing removal rate can be achieved. When the stock polishing step includes a polishing step of a plurality sub-steps of two or more, a polishing step in two or more sub-steps among these steps can also be performed using any of the polishing compositions disclosed here. The polishing composition disclosed here can be preferably applied for stock polishing at a former sub-step (upstream). For example, it can also be preferably used in an initial stock polishing step (typically, the first sub-step polishing) after a lapping step to be described below.

The stock polishing and the final polishing can be applied to both polishing using a single-side polishing machine and polishing using a double-side polishing machine. In the single-side polishing machine, a polishing object is adhered to a ceramic plate with wax or the polishing object is held using a holder called a carrier, and while a polishing composition is supplied, a polishing pad is pressed against one side of the polishing object, they are moved relative to each other (for example, rotated and moved), and thus one side of the polishing object is polished. In the double-side polishing machine, a polishing object is held using a holder called a carrier, and while a polishing composition is supplied from above, a polishing pad is pressed against a side opposite to the polishing object, these are rotated in a relative direction, and thus both sides of the polishing object are polished at the same time.

The polishing pad used in each polishing step disclosed here is not particularly limited. For example, any polishing pad of a non-woven fabric type, a suede type, a hard foamed polyurethane type, a type containing abrasive, and a type containing no abrasive may be used.

A polished object that is polished by the method disclosed here is typically cleaned after polishing. This cleaning can be performed using an appropriate cleaning solution. A cleaning solution to be used is not particularly limited, and known or conventional ones can be appropriately selected and used.

The polishing method disclosed here may include any other step in addition to the stock polishing step and the final polishing step. Examples of such a step include a lapping step performed before the stock polishing step. The lapping step is a step of polishing a polishing object by pressing the surface of a polishing platen (for example, a cast iron platen) against a polishing object. Therefore, in the lapping step, no polishing pad is used. The lapping step is typically performed by supplying abrasive (typically, diamond abrasive) between the polishing platen and the polishing object. In addition, the polishing method disclosed here may include additional steps (a cleaning step or a polishing step) before the stock polishing step or between the stock polishing step and the final polishing step.

<Method for Producing Polished Object>

The art disclosed here may include a method for producing a polished object including a polishing step using the polishing composition (for example, a method for producing a silicon carbide substrate) and a polished object produced by the method. That is, according to the art disclosed here, provided is a method for producing a polished object including supplying any of the polishing compositions disclosed here to a polishing object made of a polishing target material and polishing the polishing object, and a polished object produced by the method. The production method can be performed by preferably applying details of any of the polishing methods disclosed here. According to the production method, a polished object (for example, a silicon carbide substrate) can be efficiently provided.

EXAMPLES

Several examples relating to the present invention will be described below, but the present invention is not intended to be limited to those indicated in the examples. Here, in the following description, "%" is on a weight basis unless otherwise specified.

<Preparation of Polishing Composition>

Examples 1 to 17

A metal salt A as a polishing removal accelerator, potassium permanganate ($KMnO_4$) as an oxidant, and deionized water were mixed to prepare polishing compositions of Examples 1 to 17, In addition, as for the polishing compositions of Examples 1, 3, and 5, a pH was adjusted with potassium hydroxide (KOH).

Comparative Example 1

A polishing composition was prepared in the same procedure as in Example 1 except that no metal salt A was used.

Comparative Example 2

A polishing composition was prepared in the same procedure as in Example 17 except that alumina abrasive was used as an abrasive and no metal salt A was used. An average particle size (specific surface area conversion particle size)

based on a BET method of the alumina abrasive was 0.5 µm. In addition, in the polishing composition of Comparative Example 2, a concentration of the alumina abrasive was 6 wt % with respect to the entire polishing composition.

In the polishing composition according to the examples, types and concentrations C1 of the metal salts A used, types and concentrations C2 of oxidants, concentration ratios C1/C2, types of pH adjusting agents, and pHs are summarized in Table 1 and Table 2.

<Evaluation of Polishing Removal Rate>

The prepared polishing compositions of Examples 1 to 16 and Comparative Example 1 were directly used as polishing liquids, and polishing was performed on the surface of SiC wafers on which stock polishing had been performed in advance using a polishing liquid containing alumina abrasive under the following conditions. Then, a polishing removal rate was calculated according to the following calculation formulae (1) and (2). The results are shown in the appropriate column of Table 1.
(1) Polishing removal [cm]=a difference in weight of SiC wafer before and after polishing [g]/density of SiC [g/cm$^3$] (=3.21 g/cm$^3$)/polishing target area [cm$^2$] (=19.62 cm$^2$)
(2) Polishing removal rate [nm/h]=polishing removal [cm]× 10$^7$/polishing time (=0.5 hours)
[Polishing Conditions]
Polishing machine: Single-side polishing machine, model "EJ-380IN-CW manufactured by Engis Japan Corporation
Polishing pad: "SUBA800XY" manufactured by Nitta Haas Incorporated
Polishing pressure: 29.4 kPa
Platen rotational speed: 80 rpm
Polishing time: 1 hour
Head rotational speed: 40 rpm
Flow rate of polishing liquid: 20 mL/minutes (used in one-way)
Temperature of polishing liquid: 25° C.
Polishing object: SiC wafer (conductivity type: n-type, crystalline type 4H—SiC (0001 plane)) 2 inch×3 sheets As illustrated in Table 1, in the polishing compositions of Examples 1 to 16 in which the metal salt A and the oxidant were used in combination, the polishing removal rate was improved compared to Comparative Example 1 in which the oxidant was used alone. Based on the results, it was confirmed that the polishing removal rate could be improved using the metal salt A and the oxidant in combination. Here, although not illustrated in Table 1, in the polishing composition of Example 6 in which calcium nitrate and an oxidant were used in combination and a pH was set to 5.8, a polishing removal rate was improved compared to the polishing composition in which nitric acid and the oxidant were used in combination and a pH was set to 2.

<Evaluation of Surface after Polishing>

The prepared polishing compositions of Example 17 and Comparative Example 2 were directly used as polishing liquids, and polishing was performed on the surface of SiC wafers on which stock polishing was performed in advance using a polishing liquid containing alumina abrasive under the following conditions. In addition, a state of the surface of the SiC wafer after polishing was evaluated. The evaluation results are illustrated in the appropriate column of Table 2.
[Polishing Conditions]
Polishing machine: model "PDP-500" manufactured by Fujikoshi Machinery Corp.
Polishing pad: "SUBA800XY" manufactured by Nitta Haas Incorporated
Polishing pressure: 29.4 kPa
Platen rotational speed: 100 rpm
Polishing time: 1 hour
Head rotational speed: 100 rpm
Flow rate of polishing liquid: 20 niliminutes (used in one-way)
Temperature of polishing liquid: 25° C.
Polishing object: Prime Grade SiC wafer (conductivity type: n-type, crystalline type 4H—SiC)
4 inch×1 sheet, manufactured by Dow Corning Toray Co., Ltd.

TABLE 1

| | Metal salt A | | Oxidant | | | | | |
| --- | --- | --- | --- | --- | --- | --- | --- | --- |
| | Type | Concentration C1 (mol/L) | Type | Concentration C2 (mol/L) | Concentration ratio C1/C2 | pH adjusting agent | pH | Polishing rate (nm/h) |
| Example 1 | Sodium chloride | 0.03 | KMnO$_4$ | 0.079 | 0.38 | KOH | 7.32 | 498 |
| Example 2 | Potassium chloride | 0.1 | KMnO$_4$ | 0.079 | 1.27 | — | 5.97 | 381 |
| Example 3 | Calcium chloride | 0.6 | KMnO$_4$ | 0.079 | 7.59 | KOH | 9.09 | 338 |
| Example 4 | Strontium chloride | 0.1 | KMnO$_4$ | 0.079 | 1.27 | — | 5.71 | 533 |
| Example 5 | Calcium chloride | 0.03 | KMnO$_4$ | 0.079 | 0.38 | KOH | 8.69 | 875 |
| Example 6 | Calcium nitrate | 0.03 | KMnO$_4$ | 0.079 | 0.38 | — | 5.8 | 957 |
| Example 7 | Calcium nitrate | 0.3 | KMnO$_4$ | 0.079 | 3.8 | — | 5.85 | 592 |
| Example 8 | Calcium nitrate | 0.6 | KMnO$_4$ | 0.079 | 7.59 | — | 5.88 | 549 |
| Example 9 | Calcium nitrate | 0.05 | KMnO$_4$ | 0.263 | 0.19 | — | 6.39 | 1099 |
| Example 10 | Calcium nitrate | 0.025 | KMnO$_4$ | 0.263 | 0.095 | — | 6.5 | 1282 |
| Example 11 | Calcium nitrate | 0.014 | KMnO$_4$ | 0.263 | 0.05 | — | 5.92 | 1067 |
| Example 12 | Calcium nitrate | 0.000237 | KMnO$_4$ | 0.079 | 0.003 | — | 5.96 | 432 |
| Example 13 | Calcium nitrate | 1.58 | KMnO$_4$ | 0.079 | 20 | — | 5.9 | 394 |
| Example 14 | Calcium nitrate | 3.16 | KMnO$_4$ | 0.079 | 40 | — | 5.96 | 293 |
| Example 15 | Calcium nitrate | 3.95 | KMnO$_4$ | 0.079 | 50 | — | 5.94 | 260 |
| Example 16 | Calcium nitrate | 4.74 | KMnO$_4$ | 0.079 | 60 | — | 5.96 | 233 |
| Comparative Example 1 | — | — | KMnO$_4$ | 0.079 | — | — | 5.99 | 224 |

[Conditions for Evaluating Surface of Polishing Object after Polishing]
(Evaluation of Dent Defects such as Scratches)
Evaluation device: SiC wafer defect tester/review device, model "SICA6X" manufactured by Lasertec Corporation
Evaluation value: number of B/W defects (Black and White defects (dent defects))
(Evaluation of Latent Defects)
Evaluation device: AFM apparatus, model "Dimensiion 3100" manufactured by Bruker
Evaluation software: NanoscopeV
Evaluation conditions: evaluated at a viewing angle of 10 μm×10 μm
Evaluation points: five points in total including the center, left part, right part, upper part, and lower part of a 4-inch wafer. Among these, 4 points at the left, right, upper, and lower parts were set at positions 2 cm inside from the edge of the wafer toward the center.
Evaluation value: a total number of defects of 0.1 nm to 5 nm observed at the evaluation points.

TABLE 2

|  | Abrasive | Metal salt A Type | Metal salt A Concentration C1 (mol/L) | Oxidant Type | Oxidant Concentration C2 (mol/L) | pH adjusting agent | pH | The number of B/W defects | The number of latent defects |
|---|---|---|---|---|---|---|---|---|---|
| Example 17 | — | Calcium nitrate | 0.0152 | $KMnO_4$ | 0.105 | — | 5.64 | 3870 | 0 |
| Comparative Example 2 | Alumina | — | — | $KMnO_4$ | 0.105 | — | 5.6 | 9203 | 44 |

As illustrated in Table 2, it was found that, in the polishing composition of Example 17, compared to the composition (Comparative Example 2) in which alumina abrasive and the oxidant were used in combination, the number of B/W defects was reduced, and dent defects such as scratches could be reduced. In addition, it was found that, in the polishing composition of Example 17, compared to Comparative Example 2, the number of defects observed under an AFM also decreased and latent defects that were not detected in morphological observation could be decreased. Based on the results, it was confirmed that, when the metal salt A and the oxidant were used in combination, the quality of the surface was improved with the polishing composition having a neutral pH range and a polishing removal rate could be significantly improved.

While specific examples of the present invention have been described above in detail, these are only examples, and do not limit the scope of the claims. The techniques recited in the claims include various modifications and alternations of the specific examples exemplified above.

The invention claimed is:

1. A polishing method comprising:
supplying a polishing composition to a polishing object and polishing the polishing object, wherein a material constituting the polishing object has a Vickers hardness of 1,500 Hv or higher;
wherein:
the polishing composition comprises water, an oxidant, and a polishing accelerator;
the composition does not contain an abrasive;
the oxidant consists of a composite metal oxide;
a concentration C2 of the oxidant in the polishing composition is 0.05 mol/L or higher;
the polishing accelerator contains at least one metal salt selected from the group consisting of an alkali metal salt and an alkaline earth metal salt;
the metal salt is a normal salt that is generated by neutralization of a strong acid and a strong base;
the oxidant is different from the metal salt: and
a ratio (C1/C2) of a concentration C1 [mol/L] of the metal salt to the concentration C2 [mol/L] of the oxidant in the polishing composition is within a range of 0.001 to 70.

2. The polishing method according to claim 1, wherein the polishing composition has a pH of 5.5 or higher.

3. The polishing method according to claim 1, wherein the material constituting the polishing object is silicon carbide.

4. A polishing method comprising:
supplying a polishing composition to a polishing object and polishing the polishing object, wherein a material constituting the polishing object has a Vickers hardness of 1,500 Hv or higher;
wherein:
the polishing composition comprises water, an oxidant, and a polishing accelerator;
the composition does not include an abrasive;
the oxidant is selected from the group consisting of permanganic acids and salts thereof, vanadic acids and salts thereof, and any combination thereof;
a concentration C2 of the oxidant in the polishing composition is 0.05 mol/L or higher;
the polishing accelerator contains at least one metal salt selected from the group consisting of an alkali metal salt and an alkaline earth metal salt;
the metal salt is selected from the group consisting of lithium chloride, sodium chloride, potassium chloride, magnesium chloride, calcium chloride, strontium chloride, barium chloride, sodium bromide, potassium bromide, magnesium bromide, lithium nitrate, sodium nitrate, potassium nitrate, magnesium nitrate, calcium nitrate, strontium nitrate, barium nitrate, lithium sulfate, sodium sulfate, potassium sulfate, magnesium sulfate, calcium sulfate, strontium sulfate, and barium sulfate; and
a ratio (C1/C2) of a concentration C1 [mol/L] of the metal salt to the concentration C2 [mol/L] of the oxidant in the polishing composition is within a range of 0.001 to 70.

5. The polishing method according to claim 4, wherein the polishing composition has a pH of 5.5 or higher.

6. The polishing method according to claim 4, wherein the material constituting the polishing object is silicon carbide.

7. A polishing method comprising:
supplying a polishing composition to a polishing object and polishing the polishing object, wherein a material constituting the polishing object has a Vickers hardness of 1,500 Hv or higher;

wherein:

the polishing composition comprises water, an oxidant, and a polishing accelerator;

the composition does not include an abrasive;

the oxidant is selected from the group consisting of nitric acid, silver nitrate, aluminum nitrate, cerium ammonium nitrate, peroxomonosulfuric acid, peroxodisulfuric acid, persulfate potassium, chloric acid, salts of chloric acid, perchloric acid, potassium perchlorate, bromic acid, potassium bromate, iodic acid, ammonium iodate, sodium periodate, ferric acid, potassium ferrate, permanganic acid, sodium permanganate, potassium permanganate, chromic acid, potassium chromate, potassium dichromate, vanadic acid, ammonium vanadate, sodium vanadate, potassium vanadate, perruthenic acid, salts of perruthenic acid, molybdic acid, ammonium molybdate, disodium molybdate, perrhenic acid, salts of perrhenic acid, tungstic acid and disodium tungstate;

the polishing accelerator contains an alkaline earth metal salt;

the alkaline earth metal salt contains at least one selected from the group consisting of calcium and strontium; and the alkaline earth metal salt is a normal salt that is generated by neutralization of a strong acid and a strong base; and a ratio (C1/C2) of a concentration C1 [mol/L] of the alkaline earth metal salt to the concentration C2 [mol/L] of the oxidant in the polishing composition is within a range of 0.001 to 70.

8. The polishing method according to claim 7, wherein:

the oxidant consists of a composite metal oxide; and the alkaline earth metal salt contains a salt of hydrohalogenic acid, a salt of nitric acid, or a salt of sulfuric acid.

9. The polishing method according to claim 7, wherein:

the oxidant consists of a composite metal oxide; and a ratio (C1/C2) of a concentration C1 [mol/L] of the alkaline earth metal salt to a concentration C2 [mol/L] of the oxidant in the polishing is within a range of 0.003 to 20.

10. The polishing method according to claim 7, wherein the polishing has a pH of 5.5 or higher and 9 or lower.

11. The polishing method according to claim 7, wherein the material constituting the polishing object is silicon carbide.

\* \* \* \* \*